US008674212B2

(12) United States Patent
Huber et al.

(10) Patent No.: US 8,674,212 B2
(45) Date of Patent: Mar. 18, 2014

(54) SOLAR CELL AND MAGNETICALLY SELF-ASSEMBLED SOLAR CELL ASSEMBLY

(75) Inventors: William Hullinger Huber, Scotia, NY (US); Charles Stephen Korman, Niskayuna, NY (US); Raymond Albert Fillion, Niskayuna, NY (US); Anil Raj Duggal, Niskayuna, NY (US); William Edward Burdick, Jr., Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 1002 days.

(21) Appl. No.: 12/014,356

(22) Filed: Jan. 15, 2008

(65) Prior Publication Data

US 2009/0178709 A1   Jul. 16, 2009

(51) Int. Cl.
*H01L 31/0203* (2006.01)

(52) U.S. Cl.
USPC ............................ 136/251; 136/244; 136/256

(58) Field of Classification Search
USPC .......... 136/201, 243, 244; 438/107, 110, 120; 428/209
See application file for complete search history.

(56) References Cited

U.S. PATENT DOCUMENTS

| | | | |
|---|---|---|---|
| 3,439,416 A | 4/1969 | Yando | |
| 4,834,805 A * | 5/1989 | Erbert | 136/246 |
| 5,203,847 A | 4/1993 | Butt | |
| 5,474,060 A | 12/1995 | Evans | |
| 5,574,605 A | 11/1996 | Baumgart et al. | |
| 5,783,856 A | 7/1998 | Smith et al. | |
| 5,932,097 A | 8/1999 | Wilson | |
| 6,080,337 A | 6/2000 | Kambe et al. | |
| 6,303,218 B1 | 10/2001 | Kamiguchi et al. | |
| 6,328,856 B1 | 12/2001 | Brucker | |
| 6,331,364 B1 | 12/2001 | Baglin et al. | |
| 6,337,215 B1 | 1/2002 | Wilson | |
| 6,479,395 B1 | 11/2002 | Smith et al. | |
| 6,507,989 B1 | 1/2003 | Bowden et al. | |
| 6,555,252 B2 | 4/2003 | Sellmyer et al. | |
| 6,574,060 B2 | 6/2003 | Kanbe et al. | |
| 6,657,289 B1 | 12/2003 | Craig et al. | |
| 6,702,186 B1 | 3/2004 | Hamann et al. | |

(Continued)

FOREIGN PATENT DOCUMENTS

JP    1994085301 A    3/1994
WO   2006010260       2/2006

OTHER PUBLICATIONS

Anhalt et al., Magnetic Properties of Polymer bonded Soft Magnetic Particles for Various Filler Fractions, Journal of Applied Physics, vol. 101, 023907, pp. 1-8, 2007.*

(Continued)

*Primary Examiner* — Jayne Mershon
(74) *Attorney, Agent, or Firm* — Ann M. Agosti (57) ABSTRACT

An assembly is provided and includes at least one solar cell comprising a photovoltaic element having an upper surface for receiving and absorbing radiation, a lower surface for coupling to an article, a first end and a second end. The solar cell further includes at least one magnet attached to the first end of the photovoltaic element. The assembly further includes an article comprising a substrate, and a magnetic film disposed on the substrate and defining at least one receptor site. Each solar cell is disposed at a respective receptor site.

22 Claims, 11 Drawing Sheets

(56) References Cited

U.S. PATENT DOCUMENTS

| | | | |
|---|---|---|---|
| 6,744,583 | B2 | 6/2004 | Ikeda et al. |
| 6,749,955 | B2 | 6/2004 | Kirino et al. |
| 6,780,696 | B1 | 8/2004 | Schatz |
| 6,816,330 | B2 | 11/2004 | Ikeda et al. |
| 6,872,645 | B2 | 3/2005 | Duan et al. |
| 6,881,497 | B2 | 4/2005 | Coffey et al. |
| 6,888,178 | B2 | 5/2005 | Fonstad et al. |
| 6,927,085 | B2 | 8/2005 | Hadley et al. |
| 6,985,361 | B2 | 1/2006 | Credelle et al. |
| 7,132,222 | B2 | 11/2006 | Chappert et al. |
| 7,217,592 | B2 * | 5/2007 | Nuggehalli et al. .......... 438/107 |
| 7,218,465 | B1 | 5/2007 | Deeman et al. |
| 7,218,466 | B1 | 5/2007 | Deeman et al. |
| 2002/0187504 | A1 | 12/2002 | Reich et al. |
| 2003/0040129 | A1 | 2/2003 | Shah |
| 2003/0234401 | A1 | 12/2003 | Fonstad, Jr. et al. |
| 2004/0016998 | A1 | 1/2004 | Fonstad et al. |
| 2005/0009303 | A1 | 1/2005 | Schatz |
| 2005/0110064 | A1 | 5/2005 | Duan et al. |
| 2005/0199731 | A9 | 9/2005 | Empedocles et al. |
| 2005/0201176 | A1 | 9/2005 | Zangari et al. |
| 2005/0266271 | A1 | 12/2005 | Tsuchiya et al. |
| 2005/0272225 | A1 | 12/2005 | Weber et al. |
| 2006/0051517 | A1 | 3/2006 | Haas et al. |
| 2006/0108442 | A1 | 5/2006 | Russell et al. |
| 2007/0056621 | A1 * | 3/2007 | Baskaran ...................... 136/201 |
| 2007/0084501 | A1 * | 4/2007 | Kalberlah et al. ............ 136/245 |
| 2007/0087472 | A1 | 4/2007 | Huber et al. |
| 2007/0155025 | A1 | 7/2007 | Zhang et al. |
| 2007/0231826 | A1 | 10/2007 | Huber et al. |
| 2007/0231949 | A1 | 10/2007 | Huber et al. |
| 2007/0236213 | A1 * | 10/2007 | Paden et al. .................... 324/228 |
| 2008/0135956 | A1 * | 6/2008 | Huber et al. ................... 257/421 |
| 2009/0056513 | A1 * | 3/2009 | Baer ................................. 83/15 |
| 2009/0159125 | A1 * | 6/2009 | Prather et al. ................. 136/259 |

OTHER PUBLICATIONS

SPS Technologies, Arnold Magnetic Group Products, Catalogue Technical Notes, pp. 1-6, 2002.*
CPEL0853686 Office Action, Patent Applicatinon 200910003480.6, Mar. 9, 2010.
Office Action, U.S. Appl. No. 11/254,181, Oct. 15, 2010.
Office Action, U.S. Appl. No. 11/254,096, Sep. 10, 2010.
M. Boncheva et al., "Magnetic self-assembly of three-dimensional surfaces from planar sheets," Department of Chemistry and Chemical biology, Harvard university, www.pnas.org.,vol. 102, No. 11, Mar. 15, 2005, pp. 3924-3929.
B. B. Yellen et al.,"Arrancing matter by magnetic nanoparticle assemblers," Dept. of Mechanical Engineering and Materials Science, Duke University, www.pnas.org., vol. 102, No. 25. Jun. 21, 2005, pp. 8860-8864.
B. B. Yellen et al., "Programmable Assembly of Heterogenerous Colloidal Particle Arrays," Advanced Materials, Jan. 16, 2004, vol. 16, No. 2, pp. 111-115.
Hsi-Jen J. Yeh et al., "Fludic Self-Assembly for the Integration of GaAs Light-Emitting Diodes on Si Substrates," IEEE Photonics Technology letters, vol. 6, No. 6, Jun. 1994, pp. 706-708.
W. Zheng et al., "Shape-and-solder-directed self-assembly to package semiconductor device segments," Applied Physics letters, vol. 85, No. 16, Oct. 18, 2004, pp. 3635-3637.
U. Srinivasan et al., "Microstructure to Substrate Self-Assembly Using Capillary Forces," Journal of Microelectromechanical Systems, vol. 10, No. 1, Mar. 2001, pp. 17-24.
H.O. Jacobs et al., Fabrication of a Cylindrical Display by Patterned Assembly, www.sciencemag.org., vol. 296, Apr. 12, 2002, pp. 323-325.
J. Linemann et al., "Modeling, Simulation, and Experimentation of a promising New packaging Technology: parallel fludic Self-Assembly of Microdevices," Albert Ludwig University, Freiburg Germany, Abstract, (2004).
E. Bizdoaca et al., Magnetically directed self-assembly of submicron spheres with a $Fe_3O_4$ nanoparticle shell,: Journal of Magnetism and Magnetic Materials, vol. 240, 2002, pp. 44-46.
S. Stauth et al., "Self-assembled single-crystal silicon circuits on plastic," Proceedings of the national Academy of Sciences of the United States of America, Sep. 12, 2006, www.pnas.org., pp. 13922-13927.
W. H. Huber et al., "Articles and Assembly for Magnetically Directed Self Assembly and Methods of Manufacture," U.S. Appl. No. 11/637,668, filed Dec. 12, 2006.
U.S. Appl. No. 11/637,668 Office Action, Apr. 16, 2010.
Notice of References Cited, Huber et al., U.S. Appl. No. 11/254,094, 1 page, (2009).
U.S. Appl. No. 11/254,094, Office Action, dated Dec. 30, 2009.
U.S. Appl. No. 11/254,094, Office Action, dated Apr. 16, 2009.
U.S. Appl. No. 11/254,096, Office Action dated May 6, 2009.
U.S. Appl. No. 11/254,096, Office Action dated Nov. 3, 2009.
U.S. Appl. No. 11/254,094, Office Action dated Aug. 9, 2010.
JP06-085301 Abstract, Mar. 25, 1994.
Unofficial English translation of Office Action from CN dated Feb. 25, 2011.
Search Report and Written Opinion from corresponding EP Application No. 09150077.7-1235 dated Aug. 20, 2012.

* cited by examiner

SOLAR CELL AND MAGNETICALLY SELF-ASSEMBLED SOLAR CELL ASSEMBLY

BACKGROUND

The invention relates generally to the assembly of components onto a surface, and more particularly, to the assembly of semiconductor cells onto a substrate for solar cell applications.

One of the key problems with high-efficiency, single crystal Silicon solar cells is the overall manufacturing cost of the solar cell. A key component of the manufacturing cost is the cost of the silicon itself. However, for typical wafer-style solar cells, only the top surface of the wafer is needed to generate the maximum possible efficiency. Thus, the majority of the Silicon in a wafer-style solar cell does not contribute to the power output, resulting in high solar cell cost, per unit of power output.

One way to address the problem is to slice the wafer into long, thin strips and place the strips laterally on a substrate. In this way, nearly the entire volume of Silicon is utilized to generate electricity, thereby potentially reducing the materials cost for the solar cell. However, a chief shortcoming of this technique is the overall difficulty of laterally placing the strips on a substrate. Some techniques partially compensate for this problem by using very long strips to minimize the number of placed strips per unit of solar cell. However, the long strips are extremely fragile, resulting in a poor yield.

It would therefore be advantageous to be able to assemble solar cells on a substrate using a low-cost, high yield manufacturing process. It would further be desirable for the low-cost, high yield manufacturing process to accommodate tailoring the geometry of the solar cells to reduce the potential for damage during assembly.

BRIEF DESCRIPTION

One aspect of the present invention resides in a solar cell comprising a photovoltaic element having an upper surface for receiving and absorbing radiation, a lower surface for coupling to an article, a first end and a second end. The solar cell further comprises at least one magnet attached to the first end of the photovoltaic element.

Another aspect of the invention resides in an assembly comprising at least one solar cell. The solar cell includes a photovoltaic element having an upper surface for receiving and absorbing radiation, a lower surface for coupling to an article, a first end and a second end. The solar cell further includes at least one magnet attached to the first end of the photovoltaic element. The assembly further includes an article comprising a substrate, and a magnetic film disposed on the substrate and defining at least one receptor site. Each solar cell is disposed at a respective receptor site.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
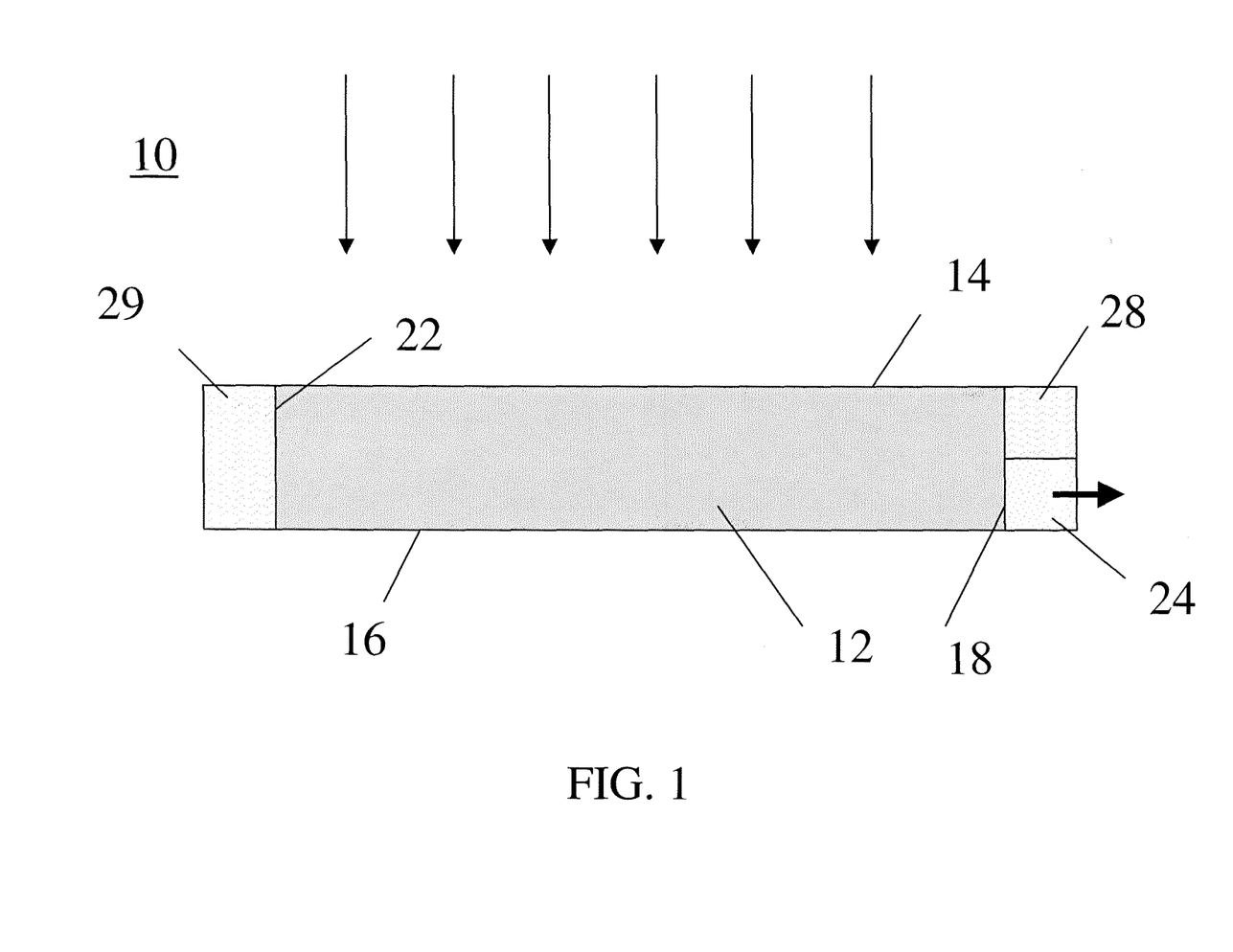
FIG. 1 schematically depicts a solar cell embodiment of the invention, in side view.

A solar cell 10 embodiment of the invention is described with reference to FIGS. 1-4. As shown for example in FIG. 1, the solar cell 10 includes a photovoltaic (PV) element 12 having an upper surface 14 for receiving and absorbing radiation, a lower surface 16 for coupling to an article (not shown in FIG. 1), a first end 18 and a second end 22. In particular embodiments, the lower surface 16 is further configured to receive and absorb radiation in order to increase the efficiency of the PV element 12. The solar cell 10 further includes at least one magnet 24 attached to the first end 18 of the photovoltaic element 12. As used here, the term "attached" should be understood to include magnets 24 deposited on or otherwise affixed, either directly or indirectly, to the PV element 12 (as indicated in FIG. 1, for example), as well as magnets 24 deposited on or otherwise affixed to an intermediate layer (not shown), such as $SiO_2$, $Si_3N$, parylene or polyimide, formed on the PV element 12. Moreover, the term "attached" also encompasses magnets 24 that are partially or fully embedded in the PV element 12 (not shown).

The focus of the present invention is on the assembly of PV elements, rather than on the particular type PV elements being assembled. Accordingly, the present invention is not limited to any particular type of PV element but rather embraces all types of PV elements, non-limiting examples of which include polycrystalline silicon (including solar grade silicon), single crystal silicon, GaAs, Germanium, Cadmium Selenide, Cadmium Telluride and Copper Indium Gallium Diselenide (CIGS).

The magnets 24 are used to self assemble the solar cells 10 onto a substrate, as discussed below. Thus, the function of the magnets 24 on the solar cell 10 is to be susceptible to the static magnetic fields emanating from the poles of the substrate surface (discussed below). It is a simultaneous requirement that freely floating solar cells 10 not produce a large enough static magnetic field that may attract other solar cells 10. Practically speaking, a susceptible magnetic material must have sufficient permeability to enable the solar cell 10 to respond to the substrate field. Additionally, the solar cells 10 must have a low enough magnetic remanence to prevent agglomeration while the solar cells 10 are at a substantial distance from the substrate.

According to particular embodiments, magnet 24 comprises a soft magnetic material. Soft magnetic materials can be employed that have high permeabilities and low remanence. Permeability and remanence are extrinsic material properties, meaning that they depend on both the characteristics of the elemental composition as well as the shape, thickness, and microstructure of the magnetic film. According to more particular embodiments, the soft magnetic material has a low-field, relative permeability, $\mu=B/H$, that is high, for example $\mu \geq 2$. As used here, the term "relative" means relative to vacuum. In certain examples, $\mu \geq 10$, in other examples, $\mu \geq 100$. Generally, the desired value of the low field, relative permeability $\mu$ for the magnets 24 will depend upon the strength of the magnetic field generated by the article 20 (discussed below with reference to FIGS. 5 and 6), which in turn depends in part upon the thickness and material properties of the magnetic portions of the article 20.

To maximize the permeability of a soft material, the elemental composition of the magnetic material is selected to minimize the magnetocrystalline and magnetoelastic anisotropies. The magnetoelastic anisotropy may be minimized by choosing compositions with minimum magnetostrictive coefficients. In one example, a quarternary Ni—Fe—Mo—Cu alloy may be chosen with an elemental composition that lies near the zero crossing of the magnetocrystalline anisotropy and magnetostrictive coefficients. In another example, an amorphous alloy containing Co, Fe, Ni, Si and B may be employed that has no magnetocrystalline anisotropy due its amorphicity and exhibits no magnetostriction due to its electronic structure.

As noted above, soft magnetic materials have low remanence. According to particular embodiments, the magnetic remanence ($M_R/M_S$) is less than about 0.2. According to more particular embodiments, $M_R/M_S$ is less than about 0.1 and still more particularly, $M_R/M_S$ is less than about 0.05. To minimize remanence, the material must return to the demagnetized state upon removal of an external magnetic field. In soft magnetic materials this is achieved by controlling the orientation and distribution of magnetic domains within the material. In one example, a magnetic anisotropy may be induced in the material by annealing the film in an external magnetic field. In this example, the vector of the anisotropy easy axis is parallel to externally applied field direction, and one component of the vector is substantially in the direction perpendicular to the surface of the magnet. In this example, the magnet acquires small, narrowly spaced domains with a minimal amount of stray magnetic field outside the volume of the magnet, yielding a low remanence. By annealing the magnet 24 in a magnetic field normal to the surface, the easy axis of magnetization is normal to the surface of the magnet.

Superparamagnetic materials may also be employed that have sufficient permeabilities and zero remanence on the time scale of interest. A superparamagnetic material has a magnetic remanence of about 0, for example $M_R/M_S<0.1$. Superparamagnetic materials are typically comprised of nanometer-sized magnetic particles embedded in a non-magnetic medium. An exemplary superparamagnetic material comprises small particles or grains of ferromagnetic material embedded in a matrix of non-ferromagnetic material. A magnetic material is considered superparamagnetic if the energy required to flip the magnetization direction within a nanoparticle is comparable to or less than the thermal energy. For example, $Fe_3O_4$ becomes superparamagnetic at room temperature if the diameter is less than approximately 10 nm. For other materials, the maximum particle size will vary, depending upon the internal magnetic anisotropy. The magnetic relaxation time of the particles or grains is set by the balance between the anisotropy energy of the material and thermal energy of the environment. Within the relaxation time, the remanence decays to zero. The permeability of superparamagnetic material is determined by the degree to which an external magnetic field biases the balance between the anisotropy and thermal energy. As such, the permeability of a superparamagnetic material is very sensitive to the temperature of the environment. To generate a higher low-field permeability (and therefore a larger binding force), a larger nanoparticle size is preferred. In general, materials with high permeability in bulk possess weak internal magnetic anisotropy. Non-limiting examples of high-permeability materials include $Fe_3O_4$, $\gamma$-$Fe_2O_3$, $Ni_{80}Fe_{20}$, $NiFe_2O_4$, $MnFe_2O_4$, Ni, Fe and combinations thereof.

Magnet 24 may be fabricated from a variety of different materials using a variety of different techniques. In certain embodiments, magnet 24 comprises a soft magnetic material selected from the group consisting of iron, cobalt, nickel and alloys, combinations and oxides thereof. As used herein alloys, oxides and combinations of iron, nickel and cobalt should be understood to encompass alloys and oxide that include other elements as well, for example manganese and/or zinc.

Figure 2:
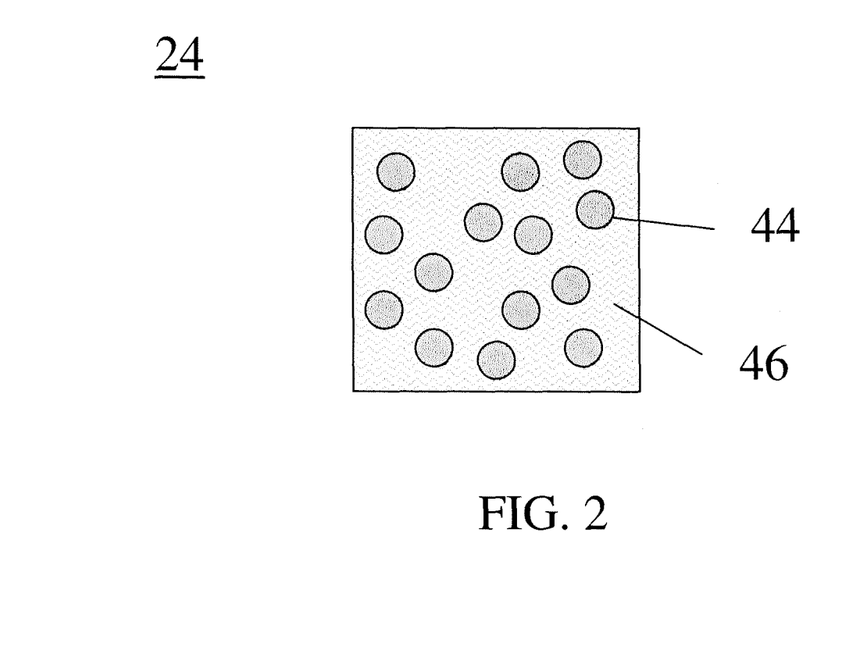
FIG. 2 schematically illustrates a dispersed magnetic powder embodiment of a magnet for use in the solar cell of FIG. 1.

In one non-limiting example illustrated by FIG. 2, magnet 24 comprises a magnetic powder 44 dispersed in a binder 46. In non-limiting examples, the magnetic powder comprises a soft magnetic material, and the binder comprises a polymeric matrix, such as an epoxy. According to more particular embodiment, magnet 24 comprises superparamagnetic nanoparticles 44 embedded in a polymer binder 46. Non-limiting examples of superparamagnetic nanoparticles 44 include $Fe_3O_4$, $\gamma$-$Fe_2O_3$, $Ni_{80}Fe_{20}$, $NiFe_2O_4$, $MnFe_2O_4$, MnZn ferrite, NiZn ferrite, Ni, Fe and combinations thereof. As is known in the art, certain magnetic nanoparticles prone to oxidation may be coated with a barrier layer to reduce oxidation. Non-limiting examples of barrier layers (not shown) include Au, Ag, $SiO_2$, $Al_2O_3$, $TiO_2$ and $Si_3N_4$. Non-limiting examples of polymer binders 46 include thermosetting compounds such as PI-2555 polyimide resin from HD Microsystems and thermoplastics such as nylon. Magnet 24 may also contain additional dispersants to reduce particle agglomeration and/or adhesion promoters as is known in the art. The compound can then be applied to the photovoltaic element 12 using a variety of different techniques as is known in the art. Non-limiting examples include, spin-coating, stencil printing, screen printing and gravure printing. The polymer binder is then cured using techniques known in the art. Depending upon the application technique, magnet 24 may be further patterned using photolithographic techniques, laser ablation or other techniques.

In other embodiments, magnet 24 is deposited using conventional thin-film process techniques, non-limiting examples include sputtering, evaporation, electroplating, and chemical vapor deposition. Non-limiting examples of magnetic films include Permalloy® (e.g. $Ni_{80}Fe_{20}$), Sendust® (FeSiAl alloy) and Fe—Co—B alloys. Magnet 24 is then annealed in a perpendicular magnetic field to orient the easy axis of magnetization towards the perpendicular direction. By orienting the easy axis away from the film plane, the remnant magnetization for fields applied in the longitudinal direction will be reduced. Thus, the tendency of the solar cells to agglomerate during assembly will be similarly reduced.

In one example of a superparamagnetic material, nanometer sized particles of magnetic compounds are dispersed in a nonmagnetic matrix. The size of the magnetic particles is controlled to give a relaxation time on the order of seconds. The volume fraction of the particles within the matrix is controlled to prevent interparticle magnetic coupling, which may interfere with the superparamagnetism. In a particular example, the magnetic particles are of the class of ferrite compounds, which include Mn—Zn and Ni—Zn ferrites. In another particular example, the magnetic particles are of the class of compounds known as garnets, which include Yttrium-Iron-Garnet (YIG) and Gadolinium-Gallium-Garnet (GGG). In another particular example, the magnetic particles may be nanoparticles of Fe, Co, or Ni metals, or alloys thereof. In another particular example, the matrix may be a polymer compound. In another example, the matrix may be a non-magnetic oxide.

In another example of a superparamagnetic material, nanometer sized grains of a ferromagnetic material are precipitated from a non-magnetic matrix. The size of the granular precipitates is controlled to give a relaxation time on the order of seconds. The volume fraction of the granular precipitates within the matrix is controlled to prevent interparticle magnetic coupling, which may interfere with the superparamagnetism. In particular example, a Co—Cu alloy film is produced with Cu being the majority constituent. In this example, an annealing process is used to precipitate superparamagnetic Co grains from the Cu. In another example, an amorphous metal alloy film is produced whose Curie temperature is selected to be below room temperature. In this example, the amorphous film is annealed to produce crystalline granular precipitates whose Curie temperatures are above room temperature and that display the required superparamagnetic behavior.

Returning now to the general description of solar cell 10, for the embodiment illustrated by FIG. 1, solar cell 10 further includes at least one contact 28 attached to the first end 18 of the photovoltaic element 12 and at least one contact 29 attached to a second end 22 of the PV element 12. In one non-limiting example, the contact 28 is disposed adjacent to the magnet 24, as indicated for example in FIG. 1.

Figure 3:
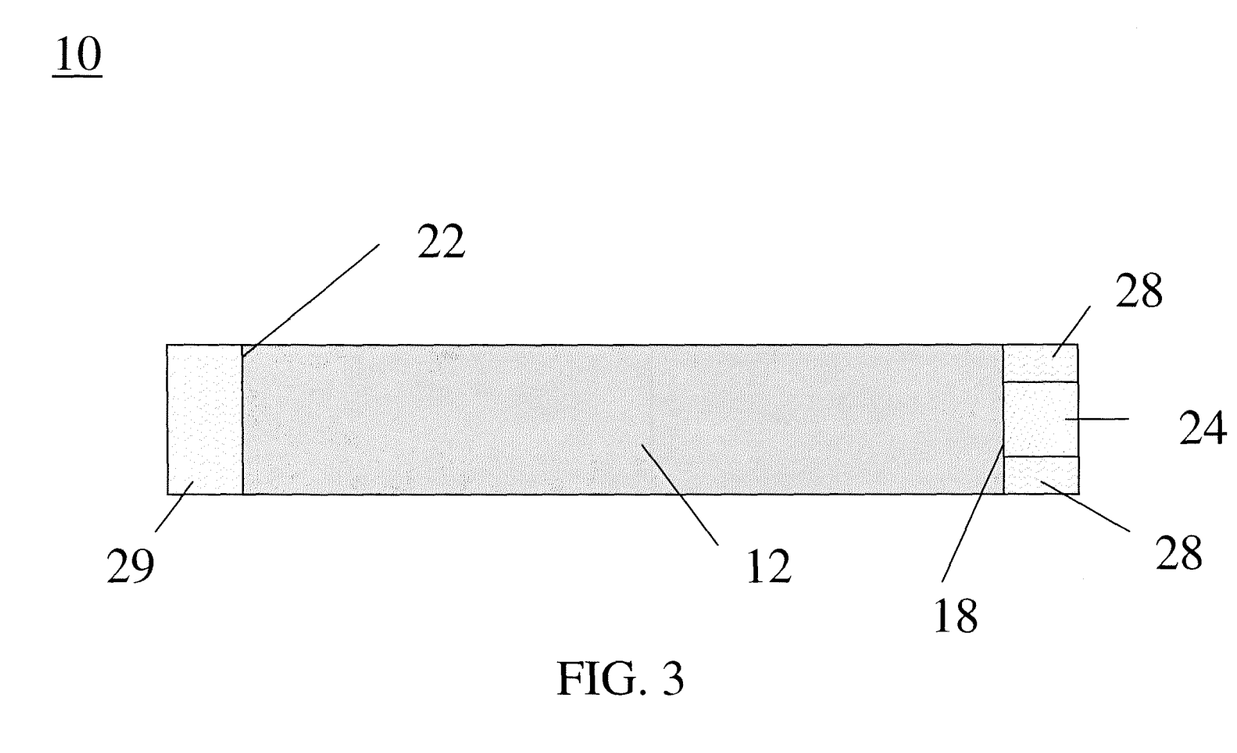
FIG. 3 illustrates an example embodiment of the solar cell in which a contact is arranged around a magnet.
Figure 4:
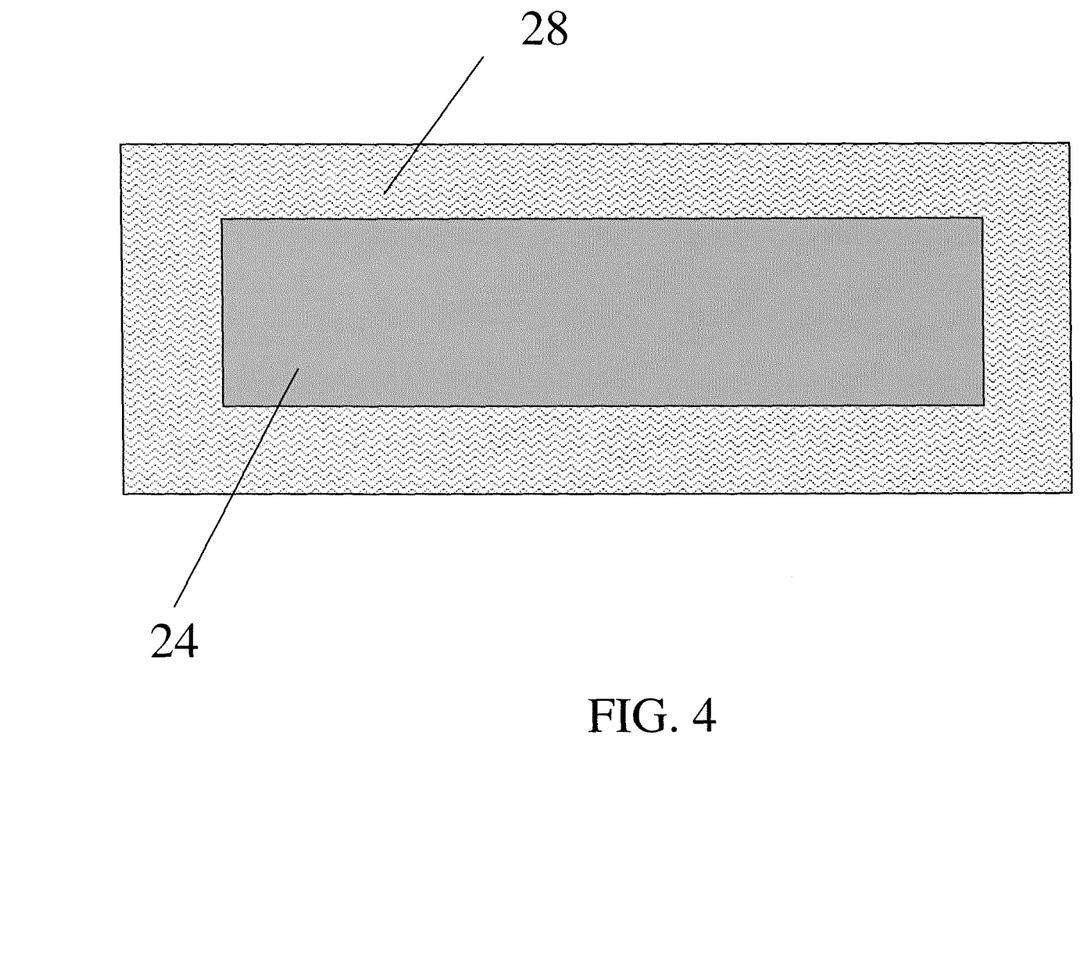
FIG. 4 is an end view of FIG. 3 showing the contact and magnet arrangement at the first end of the PV element.

In another example, the contact 28 is disposed around the magnet 24, as shown for the contact 28 at the first end 18 $f$ the PV element 12, for example in FIGS. 3 and 4. The contacts 28, 29 comprise one or more electrically conductive materials, non-limiting examples of which include gold, platinum, nickel, copper, aluminum, titanium, tungsten, tantalum, molybdenum and alloys thereof. The contacts 28, 29 may be deposited using a variety of techniques, non-limiting examples of which include screen-printing, electroplating, or physical vapor deposition, such as sputtering. According to particular embodiments, contacts 28, 29 comprises solder. In yet other examples contacts 28, 29 may include an electrically conductive material as described above and further includes a soldering material. Non-limiting examples of soldering materials include alloys of Pb, Sn, Bi, In, Ag, Au, Cd, Zn and Ga. The solder may be deposited on a gold or other conductive film, for example, forming a layered structure. The solder may be deposited on the electrical contacts 28, 29 to the solar cell 10 and/or deposited on the article 20.

An article 20 is described with reference to FIGS. 5-6. The article 20 is configured for the magnetically directed self-assembly (MDSA) of a number of solar cells 10, as illustrated, for example in FIG. 6, which shows, in top view, a number of receptor sites 36 for receiving the solar cells 10.

Figure 5:
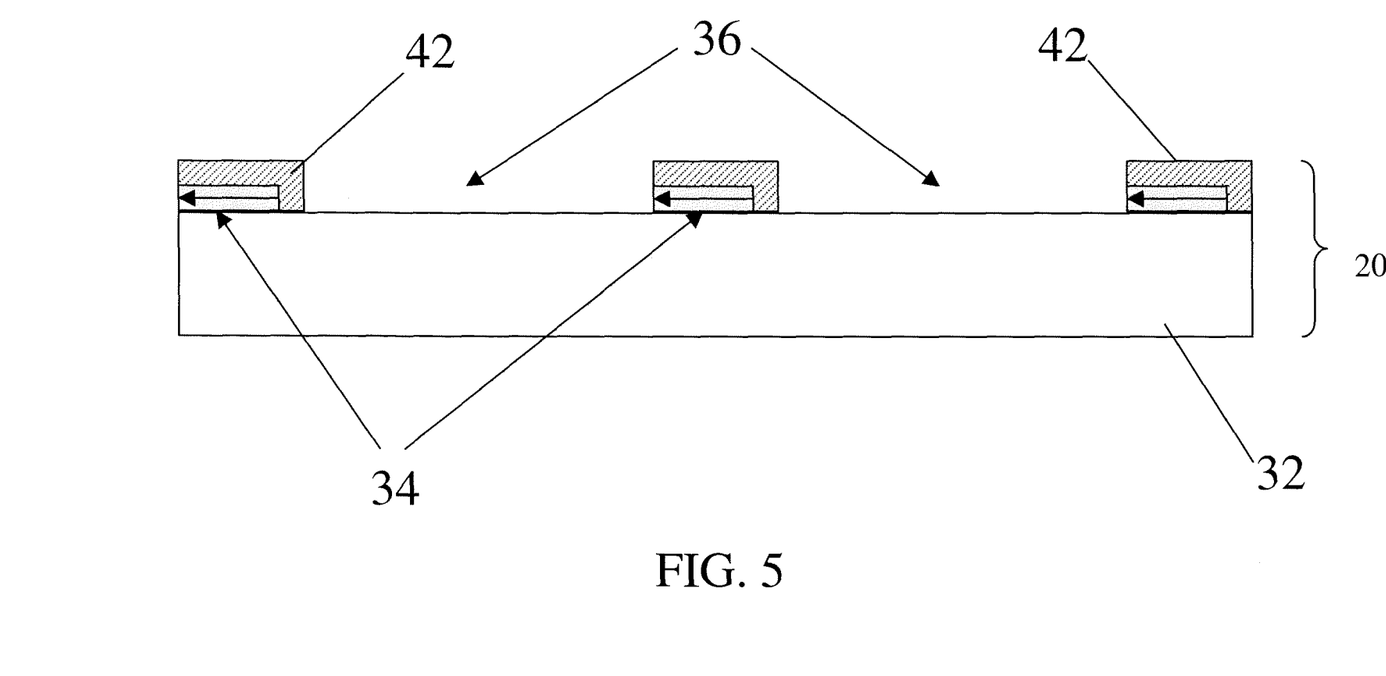
FIG. 5 schematically depicts, in side view, an article for self-assembly of the solar cells.
Figure 6:
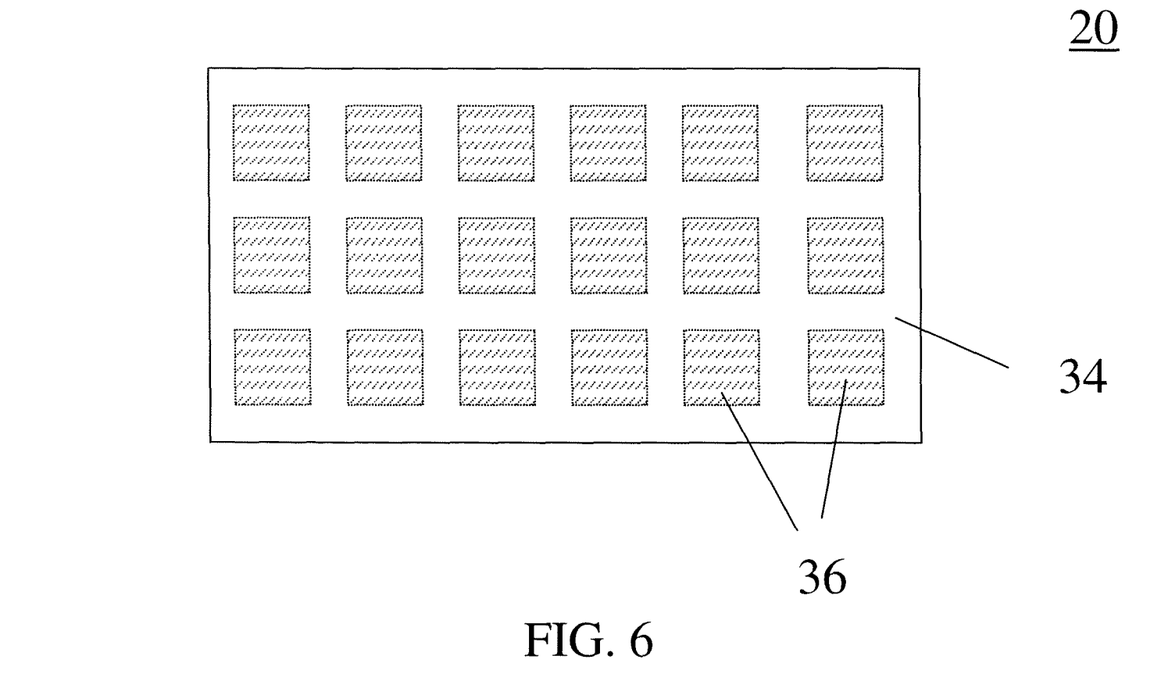
FIG. 6 is a top view schematic depiction of an example arrangement of receptor sites on an article for self-assembly of the solar cells.

As shown for example in FIGS. 5 and 6, the article 20 includes a substrate 32 and a patterned magnetic film 34 disposed on the substrate 32 and defining at least one receptor site 36. FIG. 6 is a top view of an example arrangement of receptor sites 36 for an article. This arrangement is merely illustrative. As indicated, for example in FIG. 5, the patterned magnetic film 34 is magnetized in a longitudinal direction. More generally, the patterned magnetic film 34 is magnetized primarily in a longitudinal direction As used herein, the term "film" refers to a structure having one or more layers. As used here, longitudinal magnetization refers to a film with a remnant magnetization in a direction substantially parallel to the plane of the article 20, for example within about +/−30 degrees of the plane of the article 20. For most geometries, the thickness of the magnetic films 34 is substantially less than the typical in-plane dimension. In this case, shape anisotropy causes the magnetic moment to align preferentially in plane. However if the thickness of the magnetic film 34 is comparable to or larger than the typical in-plane dimension, a hard magnetic material may be used. The hard magnetic material may be anisotropic with an in-plane easy axis or isotropic but with a large enough coercive field to overcome demagnetization fields.

As a non-limiting example, the magnetic film 34 may comprise a hard magnetic powder embedded in a polymer binder. Non-limiting examples of hard magnetic powders include Strontium ferrite, Barium ferrite, $Nd_2Fe_{14}B$, $SmCo_5$, $Sm_2Co_{17}$, $TbFe_2$, $Sm_2Fe_{17}N_x$, Alnico, CoPt alloys, FePt alloys, CoPd alloys, and FePd alloys. A non-limiting example of a polymer binder is a two-part epoxy such as Epo-Tek 360 from Epoxy Technologies. The compound may also contain additional dispersants to reduce particle agglomeration and/or adhesion promoters as is known in the art. The compound may be applied to the substrate using a variety of different techniques as is known in the art. Non-limiting examples include, spin-coating, stencil printing, screen printing and gravure printing. The polymer binder may then be cured using techniques well-known in the art. For example, a two part-epoxy such as Epo-Tek 360 from Epoxy Technologies may be cured by heating to 100 C for approximately 30 minutes. If the magnetic powder is anisotropic, a longitudinal magnetic field may be applied during curing to align the particle easy axis in the longitudinal direction. Depending upon the application technique, the magnetic film may be further patterned using photolithographic techniques or laser ablation, for example, as is known in the art. A longitudinal magnetic field is then applied to the magnetic film 34 to magnetize the film 34. For full binding strength, the magnetic field strength should be high enough to saturate the magnetization of the magnetic film 34 in the longitudinal direction.

In an alternative embodiment, the magnetic film may be deposited using traditional thin film deposition techniques such as sputtering, evaporation, chemical vapor deposition and electroplating. Non-limiting examples of thin materials include CoPt alloys, FePt alloys, CoPd alloys, FePd alloys and CoCrPt alloys. The film is then patterned into the desired geometry using conventional photolithographic techniques and/or laser ablation. A longitudinal magnetic field is then applied to the magnetic film 34 to magnetize the film 34. For full binding strength, the magnetic field strength should be high enough to saturate the magnetization of the magnetic film 34 in the longitudinal direction.

In particular embodiments, the patterned magnetic film 34 comprises at least one hard magnetic material characterized by a maximum BH product (that is, a $(BH)_{max}$ value) of greater than about one megagauss Oersted (1 MGOe). For more particular embodiments, the patterned magnetic film 34 comprises a magnetic material characterized by a maximum BH product of greater than about 10 MGOe. For particular embodiments, the magnetic film 34 comprises at least one material selected from the group consisting of samarium iron nitride, neodymium iron boride, samarium cobalt, barium ferrite, strontium ferrite, cobalt platinum alloy, cobalt palladium alloy and combinations thereof.

The magnetic film may be patterned to be void of magnetic material (air gaps) in the receptor site or may be patterned to remove some but not all of the magnetic film in the receptor site. For the illustrated embodiments, these gaps (either partial or complete) serve as the receptor sites.

Depending on the application, the receptor sites may be recessed within the substrate or may be level with the substrate 32. In particular embodiments, one or more of the receptor sites are recessed and/or are level with the substrate. Further, the receptor sites 36 may be shaped. The receptor sites 36 may also be embossed within the substrate 32.

The substrate 32 may take many forms. For particular embodiments, the substrate 32 is flexible. In one non-limiting example, the flexible substrate 32 comprises polyimide. Other non-limiting examples include polycarbonate, liquid-crystal polymer, polyetherimide, as well as metal foils, such as stainless steel. According to a particular embodiment, the substrate comprises a sheet of a flexible material, such as polyimide. Such flexible substrates desirably lend themselves to low-cost manufacture of the assembly 20 using roll-to-roll fabrication techniques. Roll-to-roll fabrication techniques employ a variety of processes, non-limiting examples of which include gravure printing, flexo printing, ink jet printing, screen printing and offset printing. Other roll-to-roll fabrication processes utilize processes adapted from traditional batch processes such as photolithography, sputtering and wet chemical etching. Other benefits to the use of flexible substrates 32 include providing a robust article 20, as compared to conventional articles formed on rigid silicon or glass substrates, for example.

For other applications, the substrate 32 may be rigid, non-limiting examples of which include silicon and glass.

Although FIGS. 5 and 6 show a patterned magnetic film 34 deposited on the substrate 32, the patterned magnetic film 34 may also be deposited on or otherwise affixed to an intermediate layer (not shown), such as a moisture and oxygen barrier layer, formed on the substrate 32. The patterned magnetic film 34 may be deposited on or other affixed to contacts formed on the substrate 32. Moreover, the term "deposited" also encompasses patterned magnetic films 34 that are partially or fully embedded in the substrate 32 (not shown).

Returning now to the general description of the article, for certain embodiments, the longitudinal magnetic film 34 has a thickness greater than about 0.2 microns. In more particular embodiments, the longitudinal magnetic film 34 has a thickness greater than about 1 micron. In other embodiments, the thickness of the longitudinal magnetic film 34 is greater than about 5 microns, and for particular embodiments the thickness of the longitudinal magnetic film 34 is in a range of about 5-100 microns. The thickness of the longitudinal magnetic film 34 depends upon the BH product for the longitudinal magnetic film 34, as well as the size of the cells 10 being assembled to the article 20.

An assembly 30 embodiment of the invention is described with reference to FIGS. 7-9. As schematically depicted, for example, in FIG. 7, assembly 30 includes at least one solar cell 10 and an article 20. Each solar cell 10 is disposed at a respective receptor site 36 on article 20. Solar cells 10 are discussed above with reference to FIGS. 1-4, and article 20 is discussed above with reference to FIGS. 5 and 6.

Figure 7:
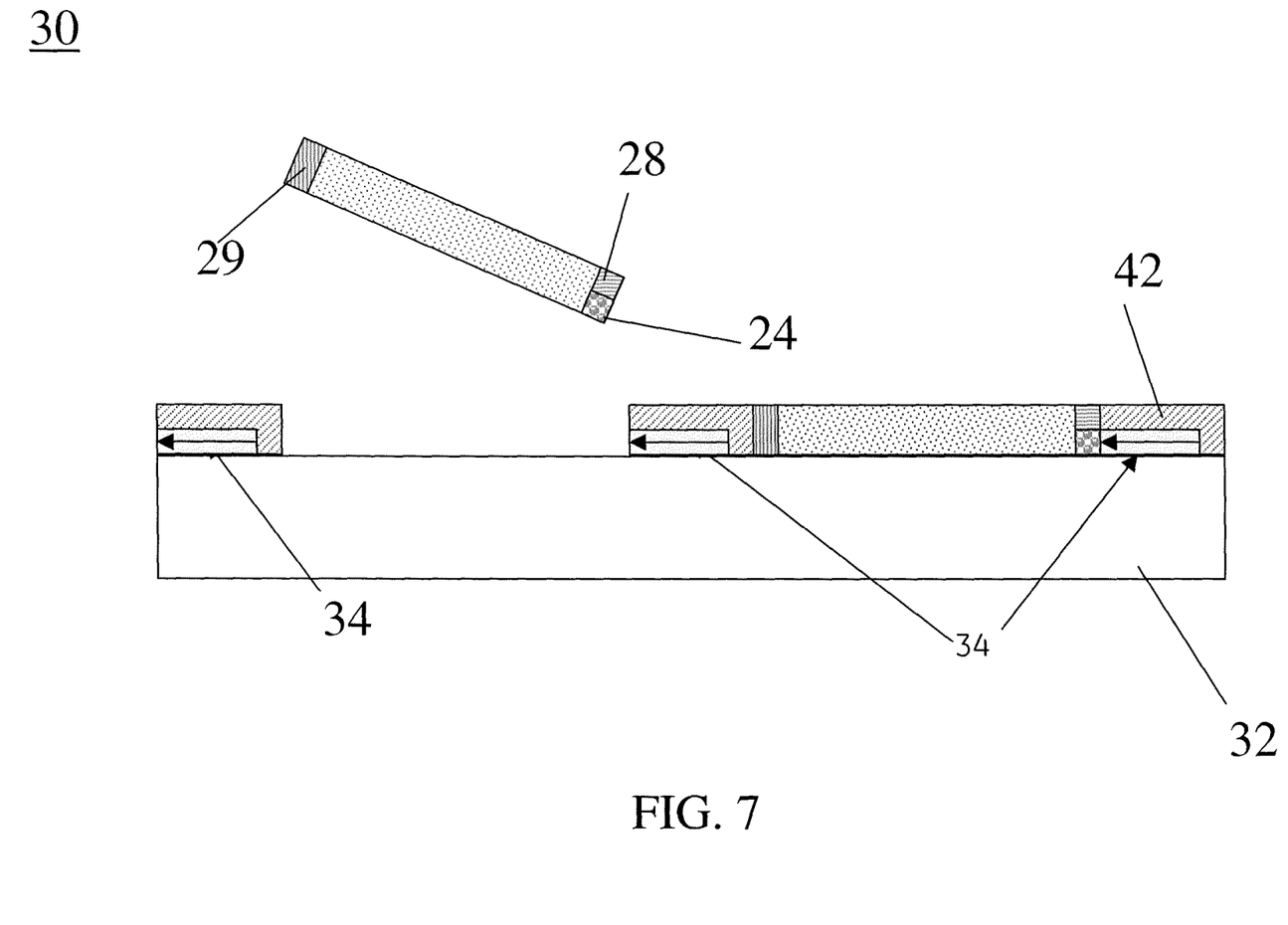
FIG. 7 illustrates the assembly of a solar cell to an article.
Figure 8:
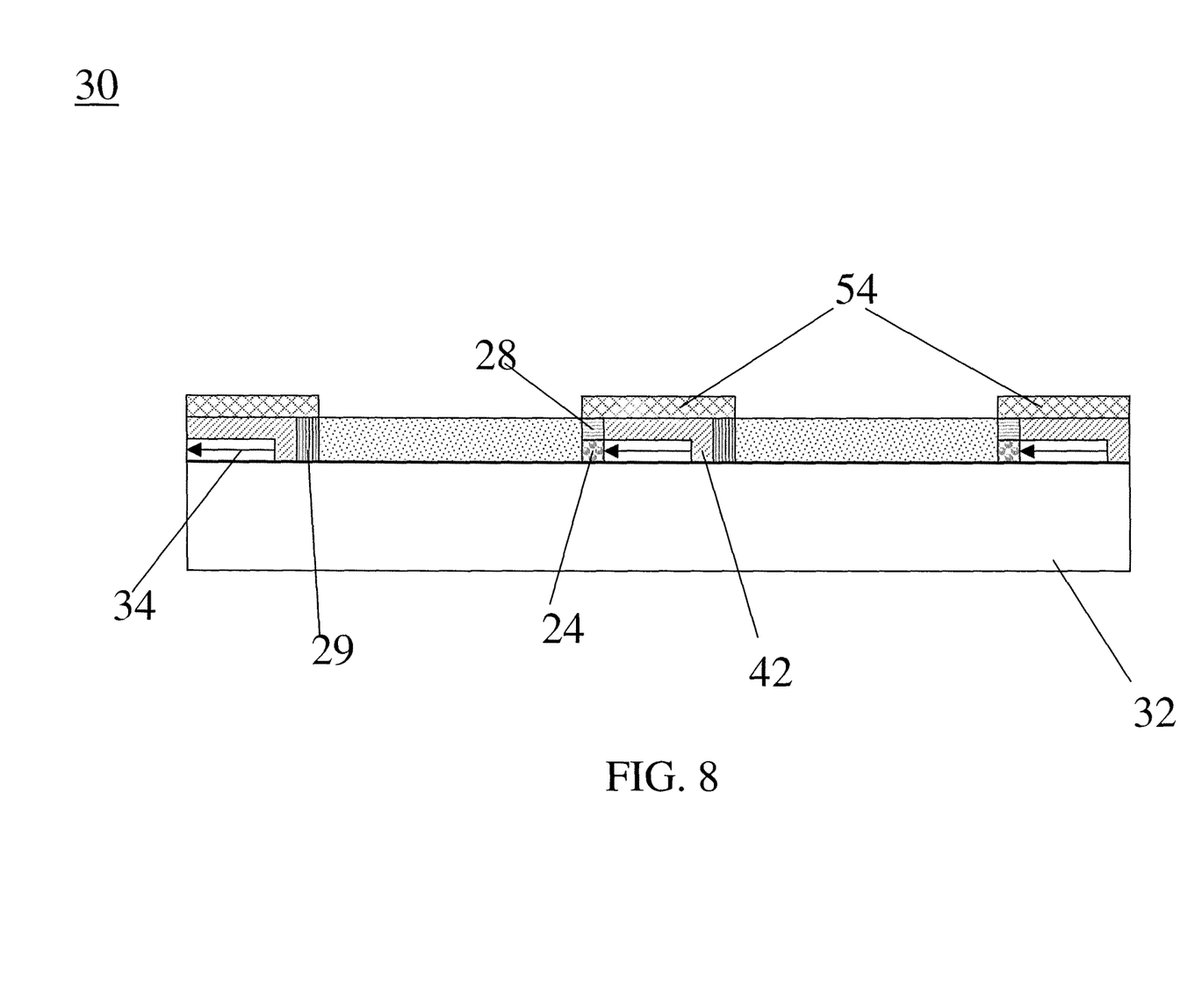
FIG. 8 shows the solar cell affixed to the article to form a solar cell assembly.

For the illustrative arrangement shown in FIGS. 7 and 8, the magnetic film 34 is a longitudinal, hard magnetic film 34. As discussed above, for particular embodiments, the magnet 24 in solar cell 10 comprises a soft magnetic material. For this arrangement, the solar cells 10 are assembled to the article 20 to form assembly 30 as follows. Initially (FIG. 7), the magnets 24 in the solar cells 10 are demagnetized. As a solar cell 10 approaches a receptor site 36, the magnet 24 for that solar cell 10 is partially magnetized by the local longitudinal magnetic fields at the receptor site 36. Upon assembly (FIG. 8), the magnet 24 is magnetized.

To provide electrical contact between the solar cells 10 and the substrate 32, the assembly 30 further includes substrate contacts 42. Further, and as discussed above with reference to FIGS. 1, 3 and 4, the solar cell 10 includes at least one cell contact 28 attached to the first end of the photovoltaic element 12. For the embodiments shown in FIGS. 7 and 8, each of the solar cells 10 further includes a cell contact 29 attached to a second end 22 of the PV cell 12. For the embodiments illustrated in FIGS. 7 and 8, the n contacts are indicated by reference numeral 28, and the p contacts are indicated by reference number 29. However, the designation of the two contact configurations 28, 29 as p, n is arbitrary and could be reversed. Moreover, the invention is not limited to the specific contact arrangement shown in FIGS. 7 and 8, but rather this example is merely illustrative. In certain applications, and as discussed above, at least one of the cell contacts 28, 29 comprises solder.

For the example arrangement shown in FIG. 7, the asymmetric arrangement of the substrate contacts 42 provides a unique binding configuration for the solar cells 10. In this manner, the p and n contacts 29, 28 for the cells 10 are uniquely bound, such that each of the cells 10 is arranged in the desired series and/or parallel combination, such that the overall assembly can be optimized for efficiency, as discussed below with reference to FIG. 9. The substrate contacts 42 can be formed of a variety of electrically conductive materials, non-limiting examples of which include gold, platinum, nickel, copper, aluminum, titanium, tungsten, tantalum, molybdenum and alloys thereof. The substrate contacts 42 may be deposited using a variety of techniques, non-limiting examples of which include screen-printing, electroplating, or physical vapor deposition, such as sputtering. In addition, for flexible substrates 32, the substrate contacts may be formed using roll-to-roll fabrication techniques. As discussed above, roll-to-roll fabrication techniques employ a variety of processes, non-limiting examples of which include gravure printing, flexo printing, ink jet printing, screen printing and offset printing.

Figure 10:
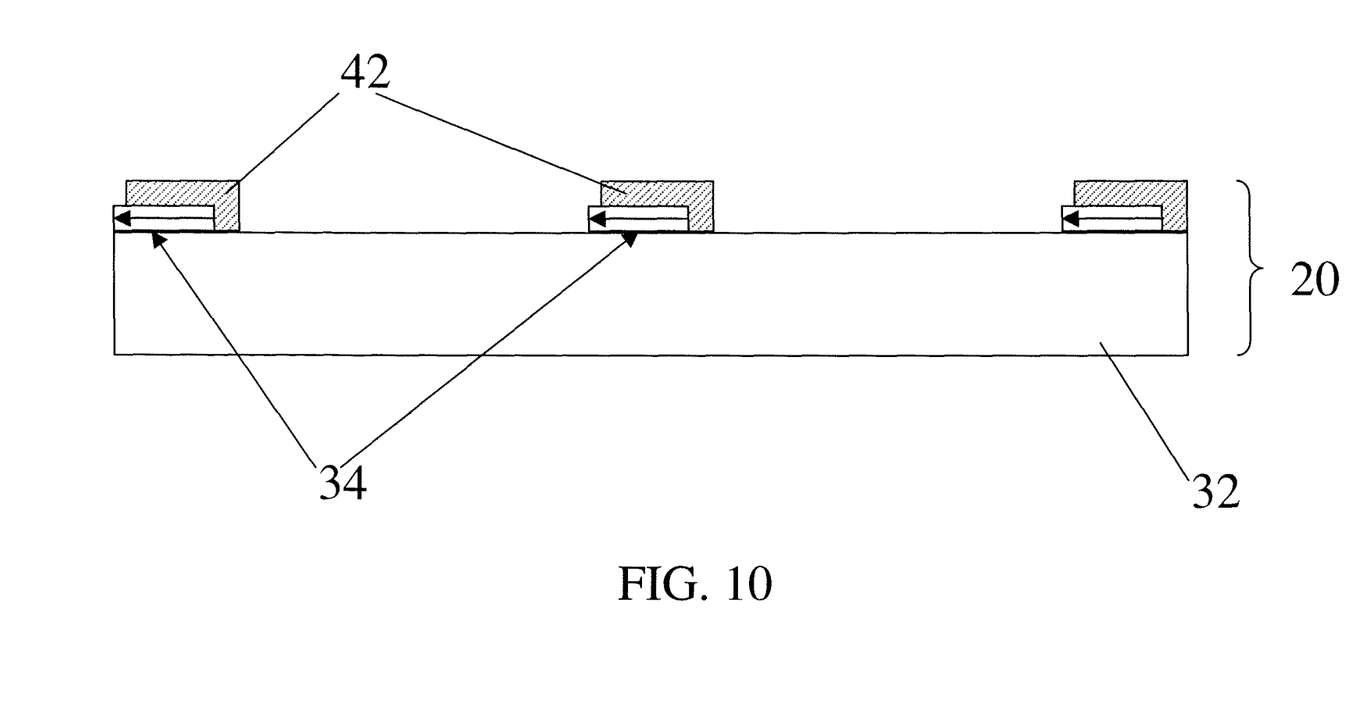
FIG. 10 schematically depicts, in side view, another arrangement of substrate contacts with pull-back, for an article for self-assembly of solar cells.
Figure 11:
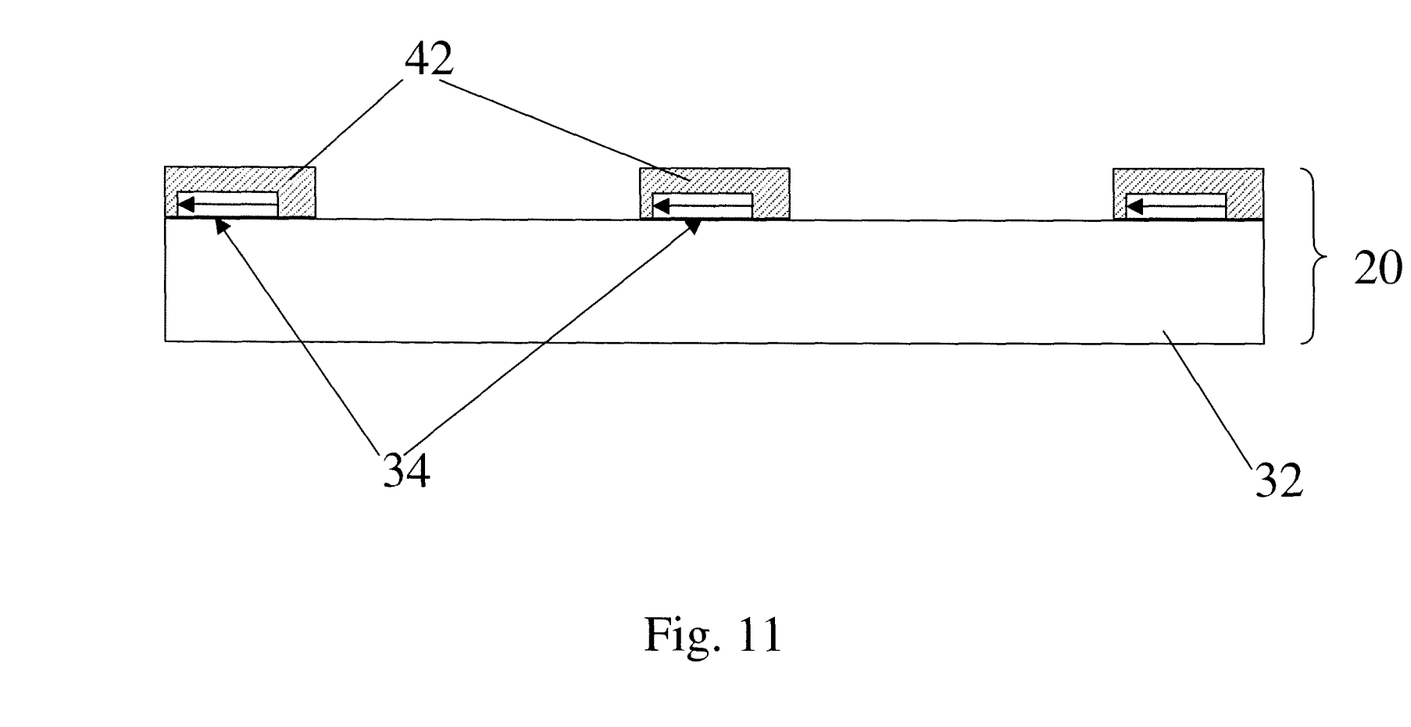
FIG. 11 schematically depicts, in side view, yet another arrangement of substrate contacts for an article for self-assembly of the solar cells.

Although FIG. 5 depicts substrate contacts 42 that are coextensive with at least one edge of the magnetic film 34, the invention is not limited to a specific arrangement of substrate contacts. For example, FIGS. 10 and 11 illustrate other substrate contact 42 arrangements. For the arrangement shown in FIG. 10, the contacts 42 are pulled back from at least one edge of the magnetic film 34, as shown. Beneficially, the arrangement of FIG. 10 provides a means for increasing the binding strength between the cell 10 and the hard magnetic film 34. For the arrangement of FIG. 11, the contacts 42 extend over opposing edges of the magnetic film 34. Beneficially, the arrangement shown in FIG. 11 reduces the likelihood that the cell 10 will align perpendicular to the substrate 32.

To further enhance the electrical contact between the solar cells 10 and the article 20, for the arrangement depicted in FIG. 8, the assembly 30 further includes at least one upper contact 54 disposed over at least a portion of one of the cell contacts 28, 29 and over at least a portion of the substrate contact layer 42. Beneficially, the upper contact 54 is used in certain applications to bridge a gap between the cell contact(s) 28, 29 and the respective substrate contacts 42. In certain applications, the upper contacts 54 are formed by printing. The upper contacts 54 can be formed using the materials and techniques noted above with reference to the substrate contacts 42.

Figure 9:
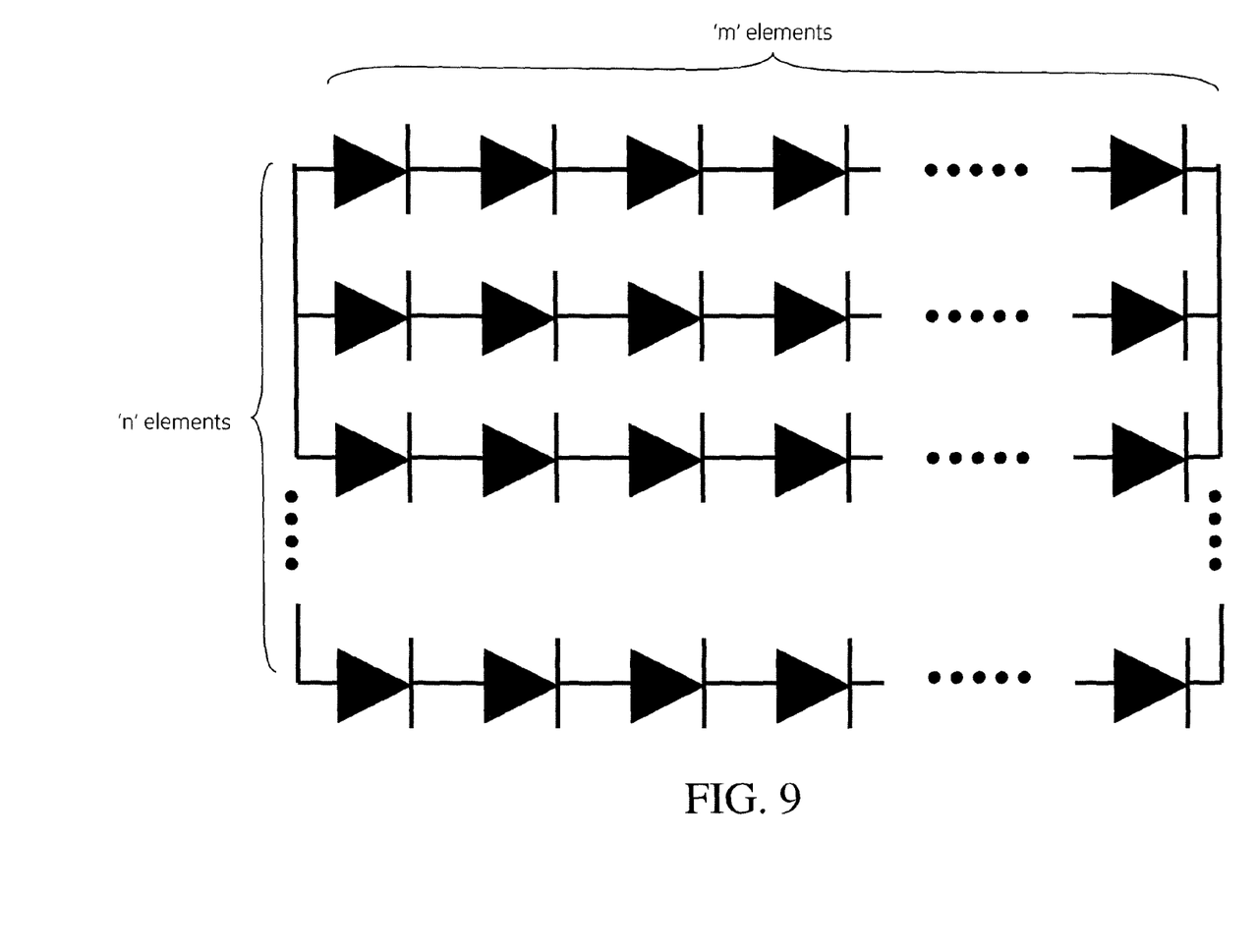
FIG. 9 schematically depicts an example arrangement of m×n solar cells.

FIG. 9 schematically depicts a series/parallel arrangement of solar cells 10. The arrangement of m solar cells 10 in series provides a large open circuit voltage equal to m*$V_{cell}$, where $V_{cell}$ is the voltage across a solar cell 10, and m is an integer and is selected based on the desired open circuit voltage for the assembly 30. In addition, the paralleling of n legs increases the short circuit current as n*$I_{sc}$, where n is an integer selected based on the desired redundancy and power for the assembly 30, and $I_{sc}$ is the short circuit current for a solar cell 10. It should be noted that series connection works best if the failure mode of an individual cell is shorted. Similarly, parallel connection works best if an individual cell is open. Therefore, depending upon the predominant failure modes, a series-parallel combination can be arranged to increase the overall yield without the need to individually test the small solar cell components. In addition and in accordance with a particular embodiment, each assembly (panel) can equipped with built-in test points that allow "bad sections" to be isolated following test of an entire panel.

Beneficially, the solar cell assembly of the present invention is a low cost, high yield assembly that can be used to form large arrangements of high-efficiency, single crystal Silicon solar cells. Because of the ease of assembly relative to conventional pick-and-place techniques, the assembly facilitates tailoring the geometry of the solar cells to reduce the potential for damage during assembly. In addition, the assembly facilitates the assembly of thin PV elements, such that the material costs, for a given power output of the assembly, can be reduced.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A solar cell comprising:
 a photovoltaic element having an upper surface for receiving and absorbing radiation, a lower surface for coupling to an article, a first end and a second end, wherein the upper surface extends between the first and the second ends, and wherein the lower surface extends between the first and the second ends; and
 at least one magnet attached to the first end of the photovoltaic element.

2. The solar cell of claim 1, wherein the magnet comprises a soft magnetic material.

3. The solar cell of claim 2, wherein the soft magnetic material has a low-field, relative permeability that is greater than at least about two.

4. The solar cell of claim 2, wherein the soft magnetic material is selected from the group consisting of iron, cobalt, nickel and alloys, combinations and oxides thereof.

5. The solar cell of claim 1, wherein the magnet comprises a magnetic powder dispersed in a binder.

6. The solar cell of claim 1, further comprising at least one cell contact attached to the first end of the photovoltaic element.

7. The solar cell of claim 1, further comprising at least one cell contact attached to a second end of the photovoltaic element.

8. The solar cell of claim 7, wherein at least one of the cell contacts comprises solder.

9. The solar cell of claim 1, wherein the photovoltaic element comprises polycrystalline silicon.

10. The solar cell of claim 1, wherein the photovoltaic element comprises single crystal silicon.

11. An assembly comprising:
 at least one solar cell comprising:
  a photovoltaic element having an upper surface for receiving and absorbing radiation, a lower surface for coupling to an article, a first end and a second end, wherein the upper surface extends between the first and the second ends, and wherein the lower surface extends between the first and the second ends, and
  at least one magnet attached to the first end of the photovoltaic element; and
 an article comprising:
  a substrate, and
  a magnetic film disposed on the substrate and defining at least one receptor site,
 wherein each of the at least one solar cell is disposed at a respective one of the at least one receptor site.

12. The assembly of claim 11, wherein the magnetic film comprises at least one hard magnetic material having a (BH)$_{max}$ value of at least about one megagauss Oersted.

13. The assembly of claim 12, wherein the magnetic film comprises at least one material selected from the group consisting of samarium iron nitride, neodinium iron boride, samarium cobalt, barium ferrite, strontium ferrite, cobalt platinum alloy, cobalt palladium alloy and combinations thereof.

14. The assembly of claim 11, wherein the magnetic film comprises a longitudinal magnetic film.

15. The assembly of claim 11, wherein the magnet comprises a soft magnetic material.

16. The assembly of claim 11, further comprising at least one substrate contact for providing electrical contact between a respective one of the at least one solar cell and the substrate.

17. The assembly of claim 16, wherein the substrate contact extends over an upper surface of the magnetic film and is coextensive with at least one edge of the magnetic film.

18. The assembly of claim 16, wherein the substrate contact partially extends over an upper surface of the magnetic film and is pulled back from least one edge of the magnetic film.

19. The assembly of claim 16, wherein the substrate contact extends over an upper surface of the magnetic film and over opposing edges of the magnetic film.

20. The assembly of claim 16, wherein the at least one solar cell further comprises at least one cell contact attached to the first end of the photovoltaic element.

21. The assembly of claim 20, wherein the at least one solar cell further comprises at least one cell contact attached to a second end of the photovoltaic element.

22. The assembly of claim 21, further comprising an upper contact disposed over at least a portion of one of the cell contacts and over at least a portion of the substrate contact.

* * * * *